US009153958B2

(12) United States Patent
de Raad et al.

(10) Patent No.: US 9,153,958 B2
(45) Date of Patent: Oct. 6, 2015

(54) BIAS-INSENSITIVE TRIGGER CIRCUIT FOR BIGFET ESD SUPPLY PROTECTION

(71) Applicant: NXP B.V., Eindhoven (NL)

(72) Inventors: Gijs de Raad, Bemmel (NL); Paul Cappon, Wijchen (NL); Albert Jan Huitsing, Nijmegen (NL)

(73) Assignee: NXP B.V., Eindhoven (NL)

( * ) Notice: Subject to any disclaimer, the term of this patent is extended or adjusted under 35 U.S.C. 154(b) by 240 days.

(21) Appl. No.: 13/968,337

(22) Filed: Aug. 15, 2013

(65) Prior Publication Data

US 2015/0049403 A1  Feb. 19, 2015

(51) Int. Cl.
| H02H 9/00 | (2006.01) |
| H02H 9/04 | (2006.01) |
| H01L 27/02 | (2006.01) |
| H03K 19/003 | (2006.01) |

(52) U.S. Cl.
CPC ........... *H02H 9/046* (2013.01); *H01L 27/0285* (2013.01); *H03K 19/00315* (2013.01)

(58) Field of Classification Search
USPC .......................................................... 361/56
See application file for complete search history.

(56) References Cited

U.S. PATENT DOCUMENTS

| 4,423,431 | A | * | 12/1983 | Sasaki ............................ 257/272 |
| 5,946,177 | A | * | 8/1999 | Miller et al. .................... 361/56 |
| 7,551,413 | B2 | * | 6/2009 | Biagi .............................. 361/56 |
| 8,576,524 | B1 | * | 11/2013 | Zupcau et al. .................. 361/56 |
| 8,654,492 | B2 | * | 2/2014 | Yeh ................................ 361/56 |
| 2007/0188953 | A1 | | 8/2007 | Lee et al. |
| 2007/0285854 | A1 | * | 12/2007 | Rodgers et al. ................. 361/56 |
| 2009/0089719 | A1 | | 4/2009 | Gauthier, Jr. et al. |
| 2010/0149701 | A1 | | 6/2010 | Drapkin et al. |
| 2010/0157491 | A1 | | 6/2010 | Hong |
| 2010/0290165 | A1 | | 11/2010 | Hartberger |
| 2011/0261489 | A1 | * | 10/2011 | Zupcau .......................... 361/56 |
| 2012/0154963 | A1 | | 6/2012 | Deval et al. |
| 2012/0180008 | A1 | | 7/2012 | Gist, III et al. |
| 2013/0100561 | A1 | * | 4/2013 | Senouci et al. ................. 361/56 |
| 2013/0128400 | A1 | | 5/2013 | Veh |
| 2014/0198415 | A1 | * | 7/2014 | Schulmeyer et al. .......... 361/56 |

FOREIGN PATENT DOCUMENTS

| EP | 2 194 578 A1 | 6/2010 |
| JP | 2011-114056 A | 6/2011 |

OTHER PUBLICATIONS

Extended European Search Report for EP Patent Appln. No. 14173944.1 (Jul. 3, 2015).

* cited by examiner

*Primary Examiner* — Stephen W Jackson
*Assistant Examiner* — Ann Hoang

(57) ABSTRACT

Embodiments of an electrostatic discharge (ESD) protection device and a method of operating an ESD protection device are described. In one embodiment, an ESD protection device for an integrated circuit (IC) device includes a bigFET configured to conduct an ESD current during an ESD event and a trigger device configured to trigger the bigFET during the ESD event. The trigger device includes a slew rate detector configured to detect the ESD event, a driver stage configured to drive the bigFET, and a keep-on latch configured to keep the driver stage turned on to drive a gate terminal of the bigFET with a driving voltage that is insensitive to a pre-bias on a drain terminal or a source terminal of the bigFET. Other embodiments are also described.

18 Claims, 6 Drawing Sheets

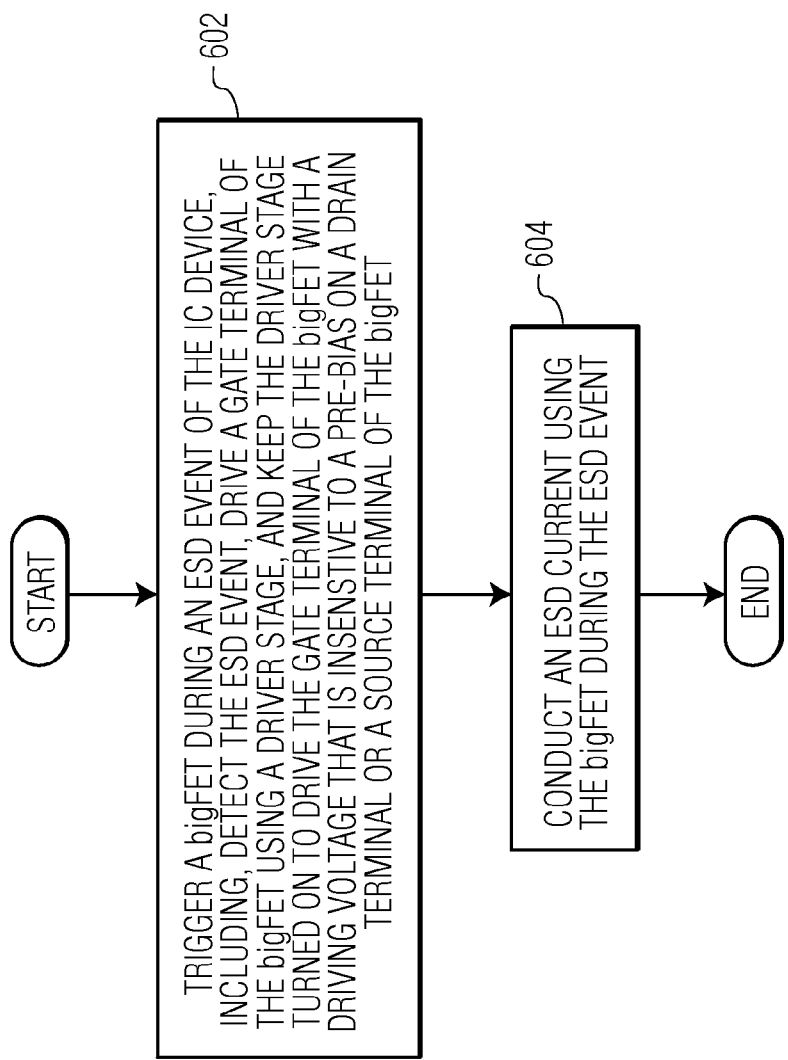

BIAS-INSENSITIVE TRIGGER CIRCUIT FOR BIGFET ESD SUPPLY PROTECTION

Embodiments of the invention relate generally to electronic hardware and methods for operating electronic hardware, and, more particularly, to electrostatic discharge (ESD) protection devices and methods for providing ESD protection for an integrated circuit (IC) device.

An ESD protection circuit can be integrated onto an IC chip to provide a low impedance channel to ground to prevent thermal damage in the IC substrate. A common ESD protection circuit, which is known as "railclamp," includes a bigFET and a trigger circuit for activating the bigFET during an ESD strike. Typically, a bigFET is an n-channel MOSFET (NMOS) transistor with a large channel width. However, it is also possible to use a p-channel MOSFET (PMOS) transistor with a large channel width as a bigFET. A bigFET based ESD protection device can be used to protect a supply domain of an IC chip from overheating during an ESD strike by shunting the ESD current from the supply domain to the ground domain.

During an ESD test such as a human-body-model (HBM) test, a machine-model (MM) test, or a charged-device-model (CDM) test, the IC chip to be tested is usually unpowered. A special class of ESD pulse is the so-called "system-level ESD pulse," as described in the International Electrotechnical Commission (IEC)-61000-4-2 standard. In contrast to HBM, MM or CDM pulses, these system level ESD pulses can be delivered to an IC chip when the IC chip is powered or unpowered. A conventional trigger circuit for a bigFET is typically designed without considering the possibility that the trigger circuit may be biased to some voltage level while an ESD pulse is delivered. However, a bigFET based ESD protection device may also be used as on-chip ESD protection for an IC chip against an ESD pulse, which is delivered while the IC chip is powered as well as unpowered. In the case that a railclamp with a conventional trigger circuit is used to protect an IC chip against system level ESD pulses, the performance of that railclamp can deteriorate when a system level ESD pulse is applied to the IC chip while the IC chip is in a powered state. Therefore, there is a need for a trigger device for a bigFET based ESD protection device that works with or without the presence of a pre-bias that is up to the maximum allowed supply voltage of an IC chip.

Embodiments of an ESD protection device and a method of operating an ESD protection device are described. In one embodiment, an ESD protection device for an IC device includes a bigFET configured to conduct an ESD current during an ESD event and a trigger device configured to trigger the bigFET during the ESD event. The trigger device includes a slew rate detector configured to detect the ESD event, a driver stage configured to drive the bigFET, and a keep-on latch configured to keep the driver stage turned on to drive a gate terminal of the bigFET with a driving voltage that is insensitive to a pre-bias on a drain terminal or a source terminal of the bigFET. Because the trigger circuit can drive the bigFET with a driving voltage that is insensitive to a pre-bias on the bigFET, the performance of the trigger circuit is insensitive to the pre-bias on the bigFET. Consequently, the ESD protection circuit can be used as on-chip ESD protection for the IC device against an ESD pulse, regardless of whether the IC device is powered or unpowered. Other embodiments are also described.

In an embodiment, an ESD protection device for an IC device includes a bigFET configured to conduct an ESD current during an ESD event and a trigger device configured to trigger the bigFET during the ESD event. The trigger device includes a slew rate detector configured to detect the ESD event, a driver stage configured to drive the bigFET, and a keep-on latch configured to keep the driver stage turned on to drive a gate terminal of the bigFET with a driving voltage that is insensitive to a pre-bias on a drain terminal or the source terminal of the bigFET.

In an embodiment, an ESD protection device for an IC device includes a bigFET configured to conduct an ESD current during an ESD event and a trigger device configured to trigger the bigFET during the ESD event. A drain terminal or a source terminal of the bigFET is connected to a supply node to which the power supply voltage of the IC device is applied. The source terminal or the drain terminal of the bigFET is connected to a ground node to which the ground voltage is applied. The trigger device includes a slew rate detector configured to detect the ESD event, a driver stage configured to drive a gate terminal of the bigFET, a pre-driver stage configured to turn on the driver stage once the ESD event is detected by the slew rate detector, and a keep-on latch configured to keep the driver stage turned on for a time duration. The slew-rate detector includes a first capacitor and a first resistor. The driver stage includes a first transistor and a second resistor. The pre-driver stage includes a second transistor and a third resistor. The keep-on latch includes a third transistor, a second capacitor, and a fourth resistor.

In an embodiment, a method of providing ESD protection for an IC device involves triggering a bigFET during an ESD event of the IC device and conducting an ESD current using the bigFET during the ESD event. Triggering the bigFET involves detecting the ESD event, driving a gate terminal of the bigFET using a driver stage, and keeping the driver stage turned on to drive the gate terminal of the bigFET with a driving voltage that is insensitive to a pre-bias on a drain terminal or a source terminal of the bigFET.

Other aspects and advantages of embodiments of the present invention will become apparent from the following detailed description, taken in conjunction with the accompanying drawings, depicted by way of example of the principles of the invention.

FIG. 6 is a process flow diagram that illustrates a method for providing ESD protection for an IC device in accordance with an embodiment of the invention.

Throughout the description, similar reference numbers may be used to identify similar elements.

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
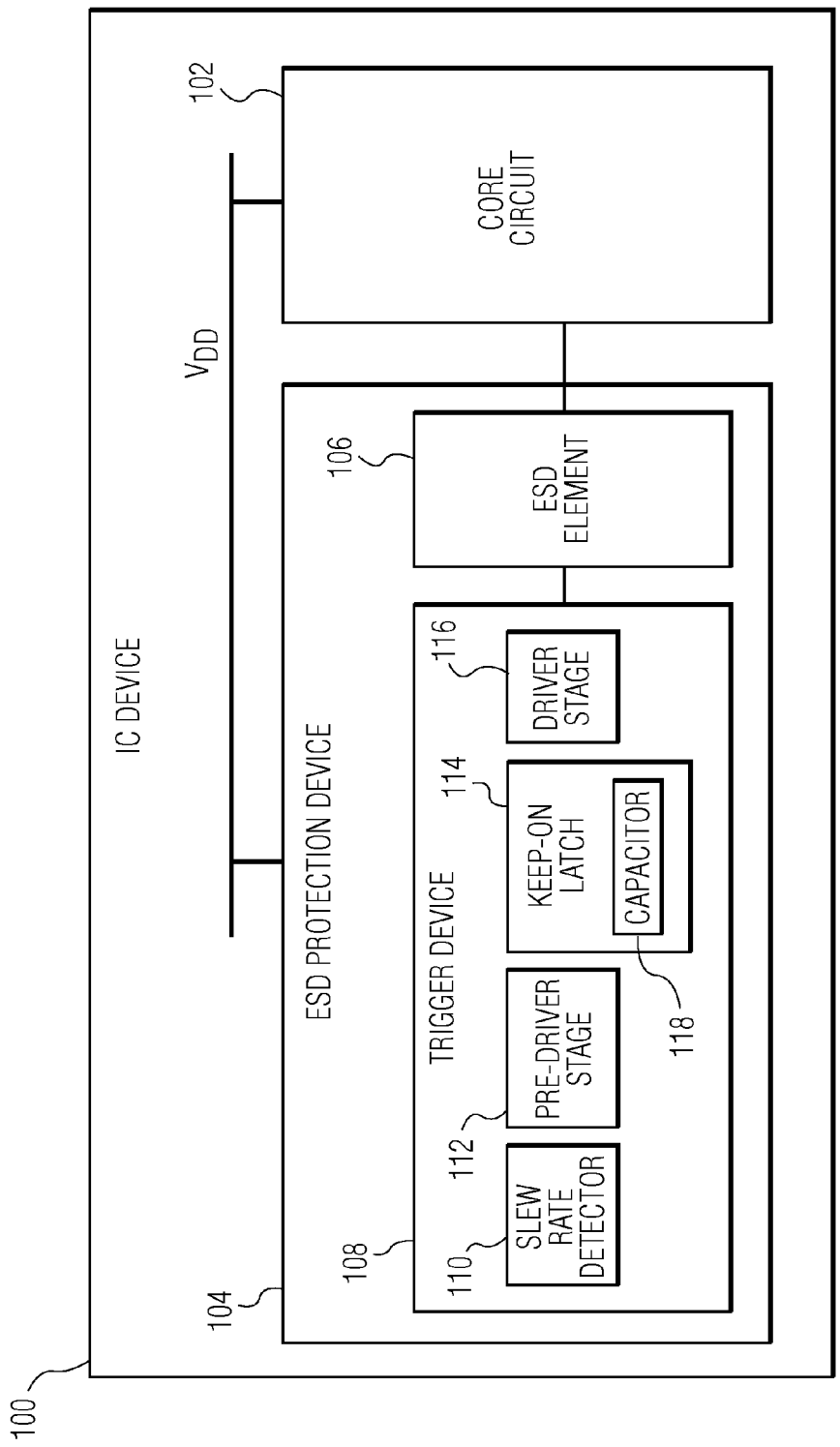
FIG. 1 is a schematic block diagram of an IC device in accordance with an embodiment of the invention.

FIG. 1 is a schematic block diagram of an IC device 100 in accordance with an embodiment of the invention. In the embodiment depicted in FIG. 1, the IC device includes a core circuit 102 and an ESD protection device 104 that is used to protect the core circuit during an ESD event, which may be an ESD test or an actual ESD strike. The IC device can be used in various applications, such as automotive applications, communications applications, industrial applications, medical applications, computer applications, and/or consumer or appliance applications. The IC device can be implemented in a substrate, such as a semiconductor wafer or a printed circuit board (PCB). In an embodiment, the IC device is packaged as a semiconductor IC chip. The IC device may be included in a microcontroller, which can be used for, for example, in vehicle control or communications, identification, wireless communications, and/or lighting control. In some embodiments, the IC device is included in a computing device, such as a smartphone, a tablet computer, a laptop, etc. For example, the IC device may be included in a Near Field Communications (NFC) capable computing device.

The core circuit 102 is a device to be protected by the ESD protection circuit in case of an ESD event. The core circuit typically includes one or more internal circuit components that are susceptible to ESD strikes. Examples of the core circuit include, but are not limited to, microcontrollers, transceivers, and switching circuits. In an embodiment, the core circuit includes a power supply domain of the IC device 100. For example, the core circuit may be connected to the power supply rail, "$V_{DD}$," of the IC device 100. Although the IC device is shown in FIG. 1 as including the core circuit and the ESD protection device 104, in other embodiments, the IC device may include additional circuit elements. For example, the IC device may include serially connected diodes that are coupled in parallel with the core circuit for current restriction and voltage surge protection.

The ESD protection device 104 protects the core circuit 102 during an ESD event. The ESD protection device 104 can be used to protect a power supply domain of the IC device 100. For example, the ESD protection device 104 may be connected to the power supply rail, "$V_{DD}$," of the IC device 100. In the embodiment depicted in FIG. 1, the ESD protection circuit 104 includes an ESD element 106 configured to conduct current during an ESD event and a trigger device 108 configured to trigger the ESD element during the ESD event.

The ESD element 106 of the ESD protection device 104 can be implemented by any suitable semiconductor device. In an embodiment, the ESD element is implemented as a bigFET, which is an NMOS with a large channel width or a PMOS transistor with a large channel width to sink ESD current. A bigFET can be used to protect a power supply domain of the IC device 100 from overvoltage during an ESD event by shunting the ESD current from the power supply domain to the ground domain (i.e., the ground). The channel width of a bigFET can be chosen to ensure that the voltage drop across the bigFET during an ESD event does not exceed a predetermined voltage, which is considered harmful to the inner circuit components (e.g., the core circuit 102) of the IC device. The predetermined voltage is typically set to be equal to or around (e.g., ±30%) the power supply voltage of the IC device.

The trigger device 108 of the ESD protection device 104 is capable of detecting an ESD event and driving the ESD element 106 for a certain amount of time during an ESD event. The trigger device can be implemented using one or more capacitors, transistors, and/or resistors. In the embodiment depicted in FIG. 1, the trigger device 108 includes a slew rate detector 110, an optional pre-driver stage 112, a keep-on latch 114, and a driver stage 116. The slew rate detector 110 is a circuit that is configured to detect an ESD event, which may be an ESD test or an actual ESD strike. In an embodiment, the slew rate detector detects a rise in the power supply voltage, "$V_{DD}$," of the IC device 100, which is characteristic of an ESD event. The pre-driver stage 112 is a circuit that is configured to turn on the driver stage 116 once an ESD event is detected by the slew rate detector. The pre-driver stage may be only active during the initial detection of an ESD event to "trigger" the driver stage. In some embodiments, the trigger device does not include the pre-driver stage. The keep-on latch 114 is a circuit that is configured to keep the driver stage turned on for the expected maximum duration of the detected ESD event. In some embodiments, the functions of the slew rate detector and the keep-on latch are implemented in a single circuit. The driver stage 116 is a circuit that is configured to drive the ESD element. In an embodiment in which the ESD element is implemented as a bigFET, the driver stage drives the gate terminal of the bigFET.

Figure 2:
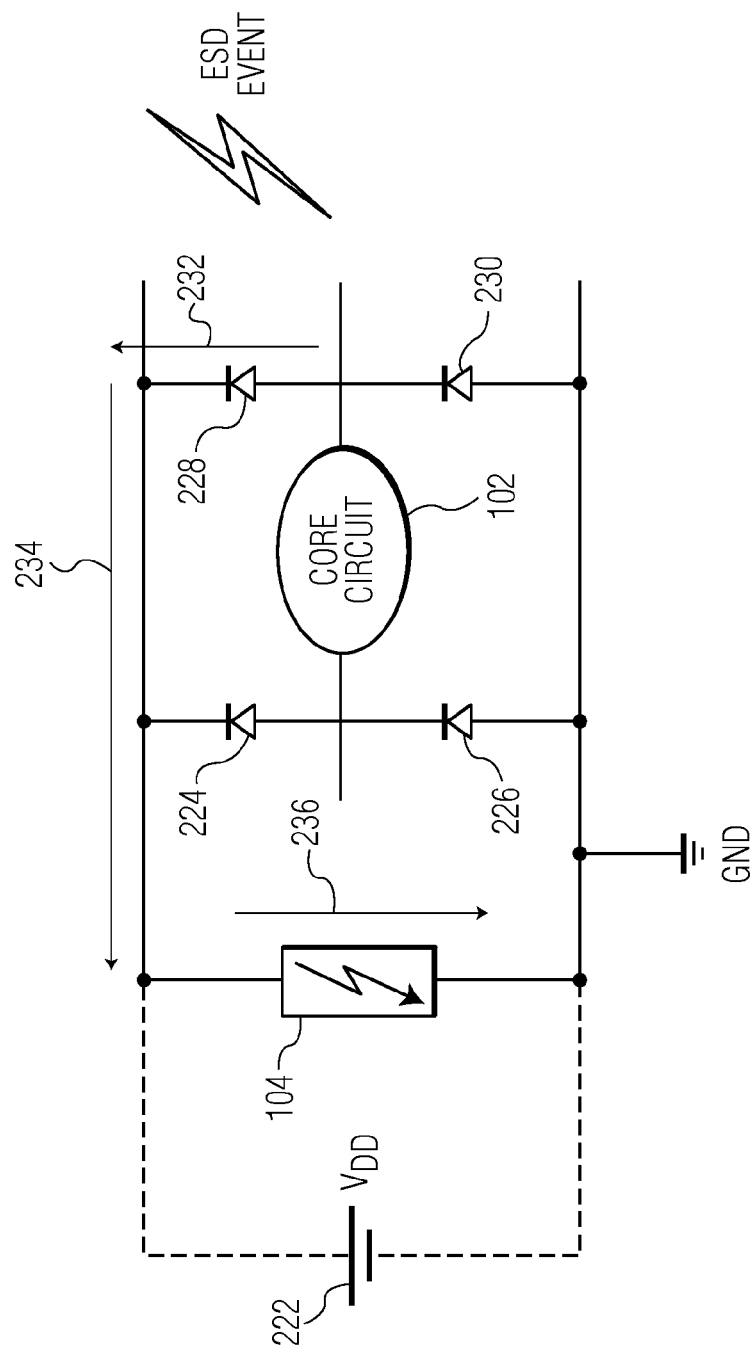
FIG. 2 illustrates an example of the voltage bias and the ESD current paths of the IC device depicted in FIG. 1 during an ESD event.

FIG. 2 illustrates an example of the voltage bias and the ESD current path of the IC device 100 during an ESD event. In FIG. 2, dashed lines signify elements on a printed circuit board (PCB) while solid lines signify elements on an IC chip. The ESD event may be an ESD test on one of the input/output (I/O) pins of the IC device or an actual ESD strike. In the embodiment depicted in FIG. 2, serially connected diodes 224, 226 and 228, 230 are connected in parallel with the core circuit 102 for current restriction and voltage surge protection purpose. When the IC device is powered on during the ESD event, the supply voltage, "$V_{DD}$," from a power supply 222 is applied to the ESD protection device 104, causing the ESD protection device to be biased to some voltage between 0V and the power supply voltage, "$V_{DD}$." Alternatively, when the IC device is powered off during an ESD event, the power supply voltage, "$V_{DD}$," is not applied to the ESD protection device. During an ESD event, electrical current flows through the serially connected diodes into the ESD protection device, as shown in arrows 232, 234, and flows into the ground (GND) through the ESD protection device, as shown in arrow 236.

In an embodiment, the keep-on latch 114 keeps the driver stage 116 on to drive the ESD element 106 with a voltage that is insensitive to the pre-bias on the ESD element. The trigger circuit 108 can drive the ESD element with a driving voltage that is independent from the power supply voltage, "$V_{DD}$," of the IC device 100. Consequently, the performance of the trigger circuit 108 is insensitive to the voltage of the power supply voltage, "$V_{DD}$," of the IC device. Compared to a conventional trigger circuit, the trigger circuit 108 depicted in FIG. 1 allows the ESD protection circuit 104 to be used as on-chip ESD protection against an ESD pulse, which is delivered while the IC device is powered or unpowered. For example, the trigger circuit 108 allows the ESD protection circuit 104 to be used in an International Electrotechnical Commission (IEC) 61000-4-2 Electrostatic Discharge Immunity Test, which can be delivered while the IC device 100 is in a powered state as well as in an unpowered state. The ESD protection circuit 104 can be either used as an extra clamp that sinks any residual current that other protection elements (e.g., on-board protection elements) fail to sink, or, to sink the entire system level ESD current of the IC device. In some embodiments, the keep-on latch 114 may include a capacitor 118 that is configured to be charged by an ESD pulse of an ESD event and to keep the driver stage 116 on over the time interval that it takes for the capacitor to discharge, which is set to be longer than the time duration of a typical ESD pulse. For example, the capacitor of the keep-on latch may not be directly connected to the power supply line, "$V_{DD}$," of the IC device. Consequently, the presence of a positive voltage on the power supply line, "$V_{DD}$," leaves the capacitor 118 of the keep-on latch 114 unbiased.

Figure 3:
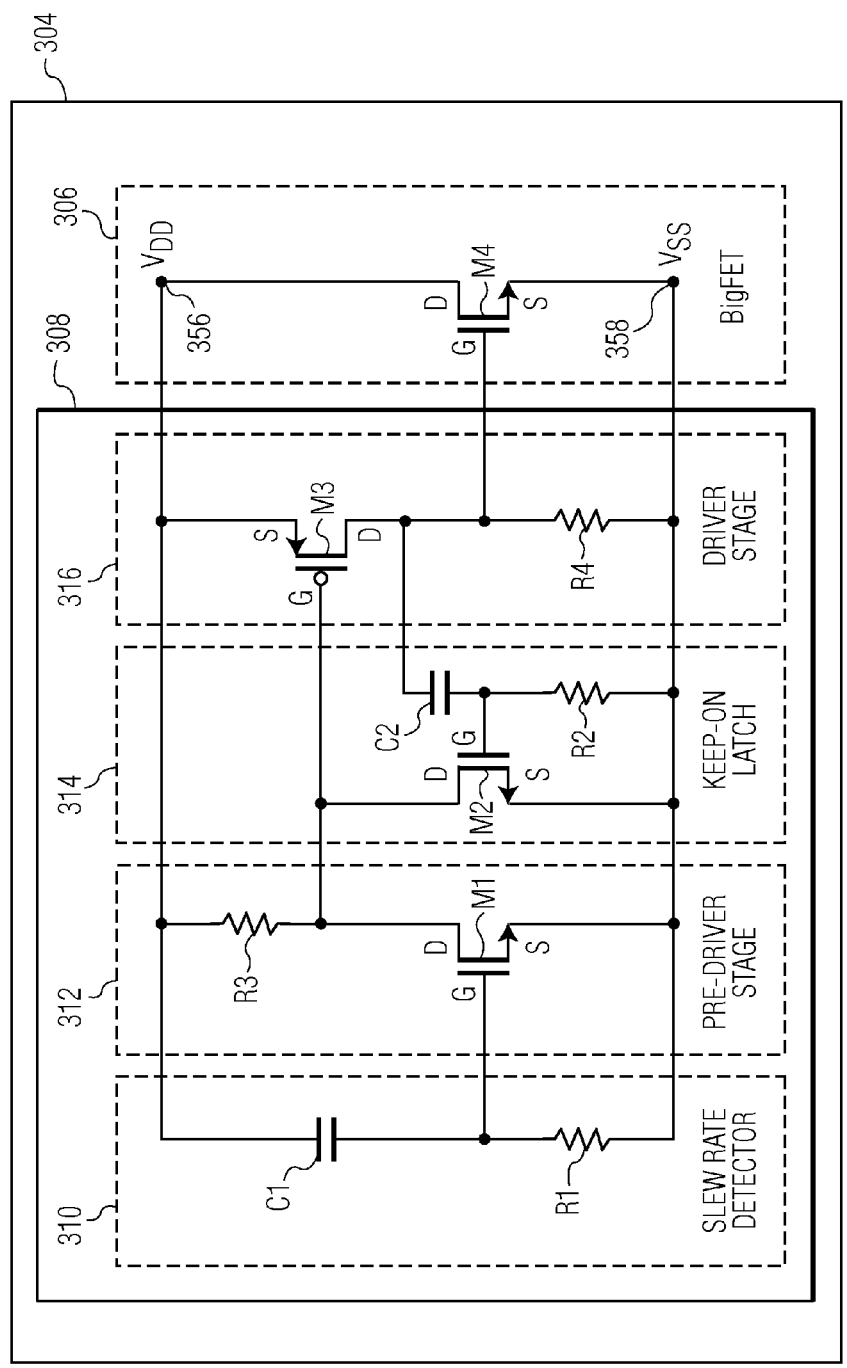
FIGS. 3-5 depict three embodiments of the ESD protection device depicted in FIG. 1.
Figure 4:
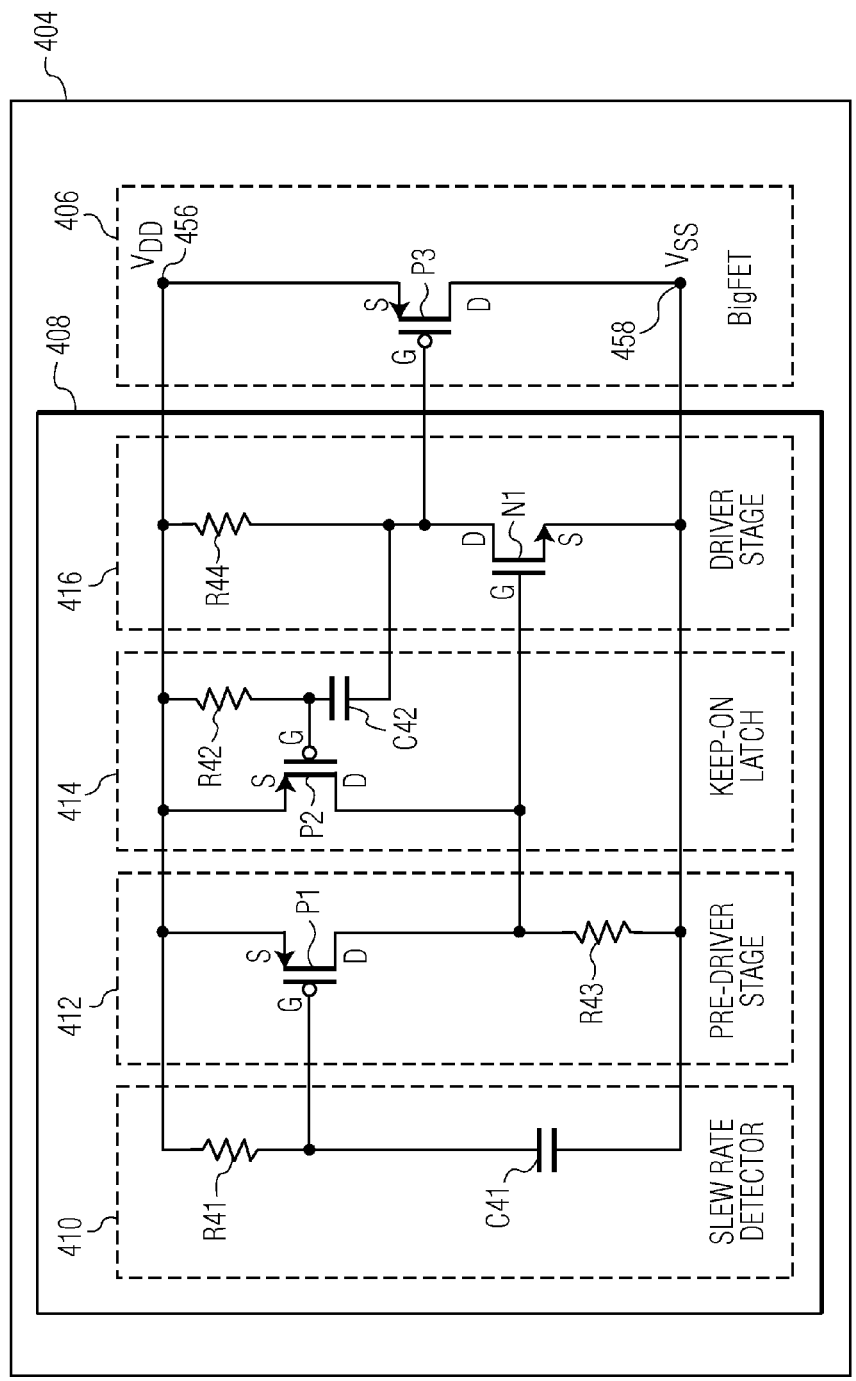
Figure 5:
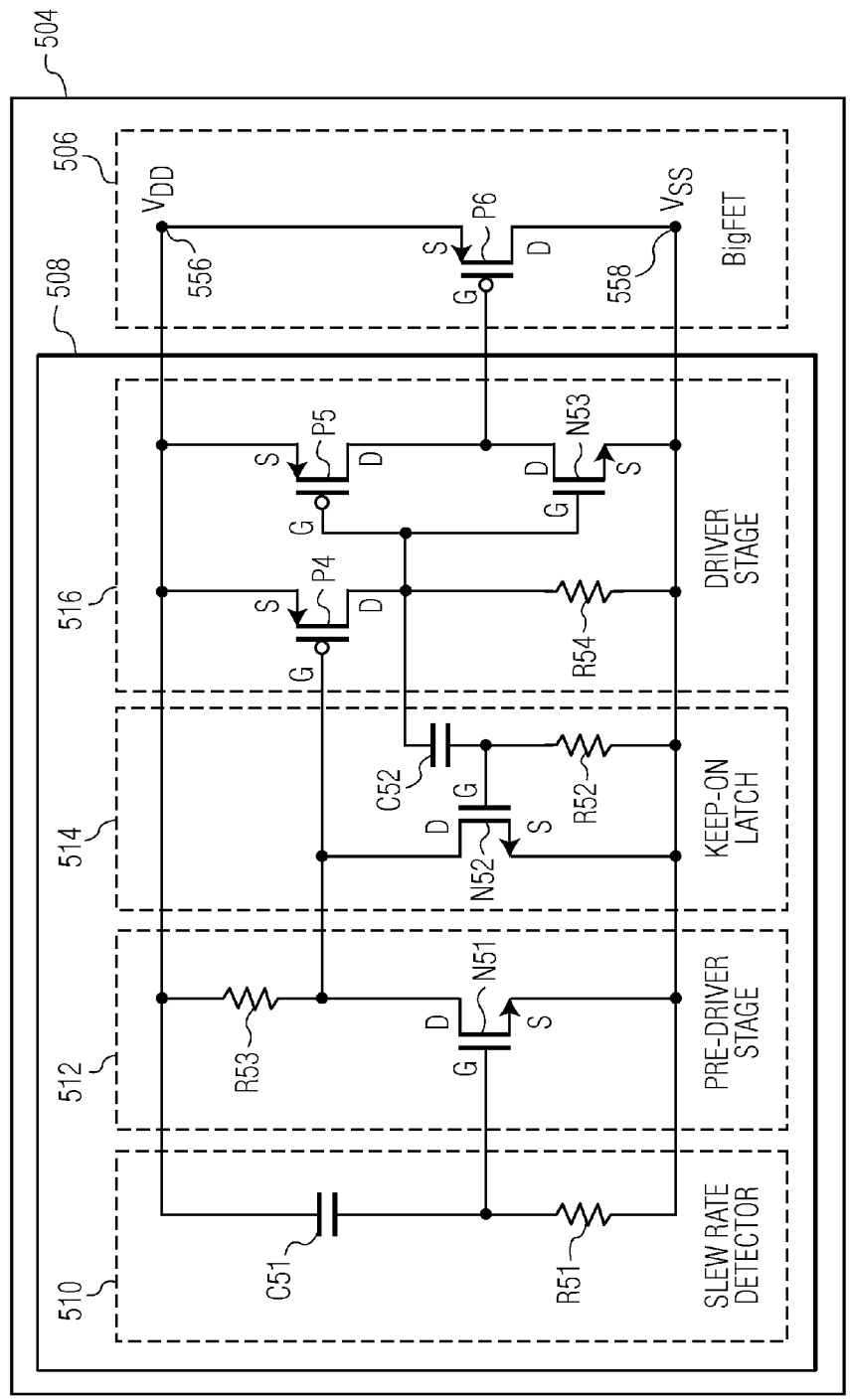

FIGS. 3-5 depict three embodiments of the ESD protection device 104 depicted in FIG. 1 that can be used as on-chip ESD protection against an ESD pulse, regardless of whether the IC device 100 is powered or unpowered. In the embodiments depicted in FIGS. 3-5, an ESD protection circuit 304, 404, or 504 includes a bigFET 306, 406, or 506 configured to conduct current during an ESD event and a trigger device 308, 408, or 508 configured to trigger/activate the bigFET during the ESD event. The ESD protection circuits 304, 304, 504 are some possible implementations of the ESD protection circuit 104 depicted in FIG. 1. However, the ESD protection circuit 104 depicted in FIG. 1 can be implemented differently from the ESD protection circuits 304, 404, 504 depicted in FIGS. 3-5. The invention is not restricted to the particular implementation of the ESD protection circuits 304, 404, 504 depicted in FIGS. 3-5.

In the embodiment depicted in FIG. 3, the ESD protection device 304 is based on the bigFET 306 that is implemented as an NMOS transistor, "M4." Specifically, the trigger device 308 and the bigFET 306 are connected to a supply voltage, "$V_{DD}$," at a power supply $V_{DD}$ node (e.g., a terminal or an input pad) 356 and a lower voltage, "$V_{SS}$," at a voltage $V_{SS}$ node 358, which is set to a voltage that is zero (the ground) or around zero. Specifically, the drain terminal, "D," of the bigFET is connected to the $V_{DD}$ node 356, the source terminal, "S," of the bigFET is connected to the $V_{SS}$ node 358, and the gate terminal, "G," of the bigFET is connected to and controlled by the trigger circuit 308. The trigger circuit 308 biases the gate terminal, "G," of the bigFET at the start of an ESD event such that the bigFET shunts the ESD current from the $V_{DD}$ node 356 to the $V_{SS}$ node 358 during the ESD event. By shunting the ESD current during the ESD event, the bigFET prevents ESD damage to itself and to all of the other circuits connected between the $V_{DD}$ node and the $V_{SS}$ node. In some embodiments, the channel width of the bigFET is chosen such that the entire ESD current caused by the ESD event flows through the bigFET while keeping the voltage drop generated across the bigFET below a pre-determined critical value, which is typically set to a value between 50% and 150% of the nominal value of $V_{DD}$.

The trigger circuit 308 lifts the gate terminal, "G," of the bigFET 306 to a positive voltage during an ESD event, keeps the gate terminal, "G," of the bigFET at the same voltage as the $V_{SS}$ node 358 when there is no ESD event, and discriminates between an ESD event and a non-ESD event by detecting a change in the potential at the drain terminal, "D," of the bigFET. During an ESD pulse, the trigger circuit sets the voltage on the gate terminal, "G," of the bigFET to be equal to the voltage on the drain terminal, "D," of the bigFET. The trigger circuit allows the voltage on the gate terminal, "G," of the bigFET to assume the voltage of the source terminal, "S," of the bigFET at all the times that no ESD event is occurring, so as to ensure a small stand-by leakage current of the bigFET.

In the embodiment depicted in FIG. 3, the trigger device 308 includes a slew rate detector 310, a pre-driver stage 312, a keep-on latch 314, and a driver stage 316. The slew-rate detector 310 includes a capacitor, "C1," which is connected to the $V_{DD}$ node 356, and a resistor, "R1," which is connected to the $V_{SS}$ node 358. The pre-driver stage 312 includes a resistor, "R3," which is connected to the $V_{DD}$ node 356, and an NMOS transistor, "M1." The gate terminal, "G," of the NMOS transistor, "M1," is connected to the capacitor, "C1," and to the resistor, "R1," the source terminal, "S," of the NMOS transistor, "M1," is connected to the $V_{SS}$ node 358, and the drain terminal, "D," of the NMOS transistor, "M1," is connected to the resistor, "R3." The keep-on latch 314 includes a capacitor, "C2," a resistor, "R2," and an NMOS transistor, "M2." The gate terminal, "G," of the NMOS transistor, "M2," is connected to the capacitor, "C2," and to the resistor, "R2," the source terminal, "S," of the NMOS transistor, "M2," is connected to the $V_{SS}$ node 358, and the drain terminal, "D," of the NMOS transistor, "M2," is connected to the resistor, "R3," and to the drain terminal, "D," of the NMOS transistor, "M1." The resistor, "R2," is connected to the $V_{SS}$ node 358. The driver stage 316 includes a PMOS transistor, "M3," and a resistor, "R4." The gate terminal, "G," of the PMOS transistor, "M3," is connected to the drain terminals of the NMOS transistors, "M1," M2," and to the resistor, "R3," the source terminal, "S," of the PMOS transistor, "M3," is connected to the $V_{DD}$ node 356, and the drain terminal, "D," of the PMOS transistor, "M3," is connected to the capacitor, "C2," the resistor, "R4," and to the gate terminal, "G," of the bigFET 306. The resistor, "R4," is connected to the $V_{SS}$ node 358 and to the gate terminal, "G," of the bigFET 306. In some embodiments, one or more capacitors of the trigger circuit 308 are replaced by one or more transistors. For example, an NMOS transistor is used to replace a capacitor that is located between the voltage, "$V_{SS}$," and some other node of the trigger circuit 308. Similarly, a PMOS transistor can be used to replace a capacitor that is located between the voltage, "$V_{DD}$" and some other node of the trigger circuit 308, or between two nodes of the trigger circuit 308 that are neither the $V_{SS}$ node 358 nor the $V_{DD}$ node 356. In some embodiments, one or more resistors of the trigger circuit are replaced by one or more transistors, poly tracks, or implanted wells. The electrical connections between the circuit elements of the ESD protection device 304 may be direct or indirect through intermediate devices.

In a conventional trigger circuit, capacitors are typically directly connected to a power supply node of an IC device.

Consequently, the presence of a voltage on a power supply node of the IC device leaves capacitors of a conventional trigger circuit biased, causing a voltage difference at the drain and gate terminal of a bigFET, which renders the conventional trigger circuit less efficient. In particular, in a conventional trigger circuit, a pre-charge on the drain node of a bigFET also is present on a capacitor in the keep-on latch. Consequently, the drive voltage of the bigFET deteriorates when a pre-bias is present, which degrades the performance of the ESD protection. In the trigger circuit 308 depicted in FIG. 3, the capacitor, "C2," of the keep-on latch 314 is connected to the drain terminal, "D," of the PMOS transistor, "M3," of the driver stage 316. In addition, the capacitor, "C2," of the keep-on latch 314 is connected to the gate terminal, "G," of the bigFET 306 rather than to the drain terminal, "D," of the bigFET. The voltage rise as a result of an ESD strike on the drain terminal, "D," of the bigFET and the voltage rise on the gate terminal, "G," of the bigFET, are nearly equal. When there is a pre-bias on the drain terminal, "D," of the bigFET, the pre-bias is not present on the gate terminal, "G," of the bigFET, and therefore is also not present on the capacitor, "C2," of the keep-on latch 314. Consequently, the presence of a voltage on the supply node $V_{DD}$ leaves the capacitor in the keep-on latch unbiased, which is sufficient to restore the full gate-source bias on the PMOS transistor, "M3," in the driver stage during an ESD event, irrespective of the presence of a positive power supply voltage, "$V_{DD}$," when the ESD strike occurs. Therefore, the driving strength of the trigger circuit 308 is insensitive to a pre-bias on the power supply node 356 and the drain terminal, "D," of the bigFET 306 and the bigFET can function optimally at any reasonable pre-bias at the power supply node 356. The ESD protection circuit 304 can operate in the same fashion with or without pre-bias from the power supply of the IC device 100. Consequently, the ESD protection circuit 304 can be used in an IEC 61000-4-2 Electrostatic Discharge Immunity Test, which can be done when the IC device 100 is powered or unpowered. The ESD protection circuit 304 can be used as on-chip ESD protection for the IC device 100 against an ESD pulse, regardless of whether the IC device is powered or unpowered.

In the embodiment depicted in FIG. 3, an NMOS transistor is used as the bigFET 306. However, the invention is applicable to both an NMOS-based bigFET and a PMOS-based bigFET. FIGS. 4 and 5 depict two embodiments of the ESD protection device 104 depicted in FIG. 1 that use a PMOS-based bigFET 406 or 506 to conduct current during an ESD event. In the embodiment depicted in FIG. 4, an ESD protection circuit 404 includes the PMOS-based bigFET 406 configured to conduct current during an ESD event and a trigger device 408 configured to trigger/activate the bigFET 406 during the ESD event. Specifically, the bigFET 406 is implemented as a PMOS transistor, "P3." The trigger device 408 and the bigFET 406 are connected to a supply voltage, "$V_{DD}$," at a power supply $V_{DD}$ node (e.g., a terminal or an input pad) 456 and a lower voltage, "$V_{SS}$," at a voltage $V_{SS}$ node 458, which is set to a voltage that is zero (the ground) or around zero. The source terminal, "S," of the bigFET 406 is connected to the $V_{DD}$ node 456, the drain terminal, "D," of the bigFET 406 is connected to the $V_{SS}$ node 458, and the gate terminal, "G," of the bigFET 406 is connected to and controlled by the trigger circuit 408. The trigger circuit 408 biases the gate terminal, "G," of the bigFET 406 at the start of an ESD event such that the bigFET 406 shunts the ESD current from the $V_{DD}$ node 456 to the $V_{SS}$ node 458 during the ESD event. By shunting the ESD current during the ESD event, the bigFET 406 prevents ESD damage to itself and to all of the other circuits connected between the $V_{DD}$ node 456 and the $V_{SS}$ node 458. In some embodiments, the channel width of the bigFET 406 is chosen such that the entire ESD current caused by the ESD event flows through the bigFET 406 while keeping the voltage drop generated across the bigFET 406 below a pre-determined critical value, which is typically set to a value between 50% and 150% of the nominal value of $V_{DD}$. The trigger device 408 includes a slew rate detector 410, a pre-driver stage 412, a keep-on latch 414, and a driver stage 416. The slew-rate detector 410 includes a capacitor, "C41," which is connected to the $V_{SS}$ node 458, and a resistor, "R41," which is connected to the $V_{DD}$ node 456. The pre-driver stage 412 includes a resistor, "R43," which is connected to the $V_{SS}$ node 458, and a PMOS transistor, "P1." The gate terminal, "G," of the PMOS transistor, "P1," is connected to the capacitor, "C41," and to the resistor, "R41," the source terminal, "S," of the PMOS transistor, "P1," is connected to the $V_{DD}$ node 456, and the drain terminal, "D," of the PMOS transistor, "P1," is connected to the resistor, "R43." The keep-on latch 414 includes a capacitor, "C42," a resistor, "R42," and a PMOS transistor, "P2." The gate terminal, "G," of the PMOS transistor, "P2," is connected to the capacitor, "C42," and to the resistor, "R42," the source terminal, "S," of the PMOS transistor, "P2," is connected to the $V_{DD}$ node 456, and the drain terminal, "D," of the PMOS transistor, "P2," is connected to the resistor, "R43." The resistor, "R42," is connected to the $V_{DD}$ node 456. The driver stage 416 includes an NMOS transistor, "N1," and a resistor, "R44." The gate terminal, "G," of the NMOS transistor, "N1," is connected to the drain terminals of the PMOS transistors, "P1," "P2," and to the resistor, "R43," the source terminal, "S," of the NMOS transistor, "N1," is connected to the $V_{SS}$ node 458, and the drain terminal, "D," of the NMOS transistor, "N1," is connected to the capacitor, "C42," the resistor, "R44," and to the gate terminal, "G," of the bigFET 406. The resistor, "R44," is connected to the $V_{DD}$ node 456 and to the gate terminal, "G," of the bigFET 406.

Turning to FIG. 5, an ESD protection circuit 504 includes the PMOS-based bigFET 506 configured to conduct current during an ESD event and a trigger device 508 configured to trigger/activate the bigFET 506 during the ESD event. Specifically, the bigFET 506 is implemented as a PMOS transistor, "P6." The trigger device 508 and the bigFET 506 are connected to a supply voltage, "$V_{DD}$," at a power supply $V_{DD}$ node (e.g., a terminal or an input pad) 556 and a lower voltage, "$V_{SS}$," at a voltage $V_{SS}$ node 558, which is set to a voltage that is zero (the ground) or around zero. The source terminal, "S," of the bigFET 506 is connected to the $V_{DD}$ node 556, the drain terminal, "D," of the bigFET 506 is connected to the $V_{SS}$ node 558, and the gate terminal, "G," of the bigFET 506 is connected to and controlled by the trigger circuit 508. The trigger circuit 508 biases the gate terminal, "G," of the bigFET 506 at the start of an ESD event such that the bigFET 506 shunts the ESD current from the $V_{DD}$ node 556 to the $V_{SS}$ node 558 during the ESD event. By shunting the ESD current during the ESD event, the bigFET 506 prevents ESD damage to itself and to all of the other circuits connected between the $V_{DD}$ node 556 and the $V_{SS}$ node 558. In some embodiments, the channel width of the bigFET 506 is chosen such that the entire ESD current caused by the ESD event flows through the bigFET 506 while keeping the voltage drop generated across the bigFET 506 below a pre-determined critical value, which is typically set to a value between 50% and 150% of the nominal value of $V_{DD}$. The trigger device 508 includes a slew rate detector 510, a pre-driver stage 512, a keep-on latch 514, and a driver stage 516. The slew-rate detector 510 includes a capacitor, "C51," which is connected to the $V_{DD}$ node 556, and a resistor, "R51," which is connected to the $V_{SS}$ node 558.

The pre-driver stage 512 includes a resistor, "R53," which is connected to the $V_{DD}$ node 556, and an NMOS transistor, "N51." The gate terminal, "G," of the NMOS transistor, "N51," is connected to the capacitor, "C51," and to the resistor, "R51," the source terminal, "S," of the NMOS transistor, "N51," is connected to the $V_{SS}$ node 558, and the drain terminal, "D," of the NMOS transistor, "N51," is connected to the resistor, "R53." The keep-on latch 514 includes a capacitor, "C52," a resistor, "R2," and an NMOS transistor, "N52." The gate terminal, "G," of the NMOS transistor, "N52," is connected to the capacitor, "C52," and to the resistor, "R52," the source terminal, "S," of the NMOS transistor, "N52," is connected to the $V_{SS}$ node 558, and the drain terminal, "D," of the NMOS transistor, "N52," is connected to the resistor, "R53," and to the drain terminal, "D," of the NMOS transistor, "N51." The resistor, "R52," is connected to the $V_{SS}$ node 558. The driver stage 516 includes PMOS transistors, "P4," "P5," an NMOS transistor, "N53," and a resistor, "R54." The gate terminal, "G," of the PMOS transistor, "P4," is connected to the drain terminals of the NMOS transistors, "N51," N52," and to the resistor, "R53," the source terminal, "S," of the PMOS transistor, "P4," is connected to the $V_{DD}$ node 556, and the drain terminal, "D," of the PMOS transistor, "P4," is connected to the capacitor, "C2," the resistor, "R54," and to the gate terminals, "G," of the transistors, "P5," "N53." The resistor, "R54," is connected to the $V_{SS}$ node 558, to the gate terminals, "G," of the transistors, "P5," "N53," and to the drain terminal, "D," of the PMOS transistor, "P4."

FIG. 6 is a process flow diagram that illustrates a method for providing ESD protection for an IC device in accordance with an embodiment of the invention. The IC device may be the same as or similar to the IC device 100 depicted in FIG. 1. At block 602, a bigFET is triggered during an ESD event of the IC device by detecting the ESD event, driving a gate terminal of the bigFET using a driver stage, and keeping the driver stage turned on to drive the gate terminal of the bigFET with a driving voltage that is insensitive to a pre-bias on a drain terminal or a source terminal of the bigFET. At block 604, an ESD current is conducted using the bigFET during the ESD event. The bigFET may be the same as or similar to the bigFETs 306, 406, 506 depicted in FIGS. 3-5.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement less or more features.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. An electrostatic discharge (ESD) protection device for an integrated circuit (IC) device, the ESD protection device comprising:
    a bigFET configured to conduct an ESD current during an ESD event; and
    a trigger device configured to trigger the bigFET during the ESD event, the trigger device comprising:
        a slew rate detector configured to detect the ESD event;
        a driver stage configured to drive the bigFET; and
        a keep-on latch configured to keep the driver stage turned on to drive a gate terminal of the bigFET with a driving voltage
    that is insensitive to a pre-bias on a drain terminal or a source terminal of the bigFET;
    wherein the drain terminal or the source terminal of the bigFET is connected to a supply node to which a power supply voltage of the IC device is applied, wherein the source terminal or the drain terminal of the bigFET is connected to a second node to which a second voltage is applied, and wherein the second voltage is lower than the power supply voltage of the IC device,
    wherein the keep-on latch comprises:
        an NMOS transistor, wherein a source terminal of the NMOS transistor is connected to the second node, and wherein a drain terminal of the NMOS transistor is connected to the driver stage; and
        a capacitor connected to a gate terminal of the NMOS transistor and to a gate terminal of the bigFET.

2. The ESD protection device of claim 1, wherein the keep-on latch comprises a capacitor, and wherein the capacitor is not directly connected to a power supply node or a ground node of the IC device.

3. The ESD protection device of claim 2, wherein the capacitor is configured to be charged by the ESD current and to be discharged to keep the driver stage turned on during the ESD event.

4. The ESD protection device of claim 1, wherein the bigFET comprises an NMOS device or a PMOS device.

5. The ESD protection device of claim 4, wherein a channel width of the bigFET is chosen such that a voltage drop generated across the bigFET during the ESD event is below a pre-determined critical value.

6. The ESD protection device of claim 1, wherein the second voltage is the ground.

7. The ESD protection device of claim 1, wherein the driver stage is configured to bias a gate terminal of the bigFET such that the bigFET shunts the ESD current from the supply node to the second node during the ESD event.

8. The ESD protection device of claim 1, wherein the driver stage comprises a PMOS transistor, wherein a drain terminal of the PMOS transistor is connected to the capacitor and to the gate terminal of the bigFET, and wherein a source terminal of the PMOS transistor is connected to the supply node.

9. The ESD protection device of claim 8, wherein each of the keep-on latch and the driver stage further comprises a resistor that is connected to the capacitor and to the second node.

10. The ESD protection device of claim 8, wherein the slew-rate detector comprises:
    a second capacitor connected to the supply node; and
    a first resistor connected to the second capacitor and to the second node.

11. The ESD protection device of claim 10, wherein the trigger device further comprises a pre-driver stage configured to turn on the driver stage once the ESD event is detected by the slew rate detector.

12. The ESD protection device of claim 11, wherein the pre-driver stage comprises:
    a second NMOS transistor, wherein a gate terminal of the second NMOS transistor is connected to the second capacitor and to the first resistor, and wherein a source terminal of the second NMOS transistor is connected to the second node; and a second resistor connected to a drain terminal of the second NMOS transistor and to the supply node.

13. The ESD protection device of claim 4, wherein the trigger device is configured to set a voltage on a gate terminal of the bigFET to be equal to a voltage on the drain terminal or the source terminal of the bigFET during the ESD event.

14. The ESD protection device of claim 13, wherein the trigger device is configured to set the voltage on the gate terminal of the bigFET to be equal to a voltage on the source terminal or the drain terminal of the bigFET before the ESD event and a pre-determined time duration after the ESD event.

15. The IC device comprising the ESD protection device of claim 1 and a device to be protected.

16. An electrostatic discharge (ESD) protection device for an integrated circuit (IC) device, the ESD protection device comprising:
   a bigFET configured to conduct an ESD current during an ESD event, wherein a drain terminal or a source terminal of the bigFET is connected to a supply node to which the power supply voltage of the IC device is applied, and wherein the source terminal or the drain terminal of the bigFET is connected to a ground node to which the ground voltage is applied; and
   a trigger device configured to trigger the bigFET during the ESD event, the trigger device comprising:
      a slew rate detector configured to detect the ESD event, wherein the slew-rate detector comprises a first capacitor and a first resistor;
      a driver stage configured to drive a gate terminal of the bigFET, wherein the driver stage comprises a first transistor and a second resistor; and
      a pre-driver stage configured to turn on the driver stage once the ESD event is detected by the slew rate detector, wherein the pre-driver stage comprises a second transistor and a third resistor; and
      a keep-on latch configured to keep the driver stage turned on for a time duration, wherein the keep-on latch comprises a third transistor, a second capacitor, and a fourth resistor, wherein a source terminal of the third transistor is connected to the ground node, wherein a drain terminal of the third transistor is connected to a drain terminal of the second transistor, the third resistor, and a gate terminal of the first transistor, wherein the second capacitor is connected to a gate terminal of the third transistor, a drain terminal of the first transistor, and the second resistor, and wherein the fourth resistor is connected to the gate terminal of the third transistor, the second capacitor, and the ground node.

17. The ESD protection device of claim 16, wherein the first transistor is a PMOS transistor, wherein a source terminal of the PMOS transistor is connected to the supply node, wherein the second resistor is connected to the drain terminal of the PMOS transistor, wherein the second transistor is a first NMOS transistor, wherein a gate terminal of the first NMOS transistor is connected to the first capacitor and to the first resistor, wherein a source terminal of the first NMOS transistor is connected to the ground node, wherein the third resistor is connected to a drain terminal of the first NMOS transistor and to the supply node, and wherein the third transistor is a second NMOS transistor.

18. A method of providing electrostatic discharge (ESD) protection for an integrated circuit (IC) device, the method comprising:
   triggering a bigFET during an ESD event of the IC device, wherein triggering the bigFET comprises:
      detecting the ESD event;
      driving a gate terminal of the bigFET using a driver stage; and
      keeping the driver stage turned on to drive the gate terminal of the big FET with a driving voltage that is insensitive to a pre-bias on a drain terminal or a source terminal of the bigFET using a keep-on latch, wherein the drain terminal or the source terminal of the big FET is connected to a supply node to which a power supply voltage of the IC device is applied, wherein the source terminal or the drain terminal of the big FET is connected to a second node to which a second voltage is applied, and wherein the second voltage is lower than the power supply voltage of the IC device, wherein the keep-on latch comprises:
      an NMOS transistor, wherein a source terminal of the NMOS transistor is connected to the second node, and wherein a drain terminal of the NMOS transistor is connected to the driver stage; and
      a capacitor connected between a gate terminal of the NMOS transistor and a gate terminal of the bigFET; and
   conducting an ESD current using the bigFET during the ESD event.

* * * * *